US012374626B2

(12) United States Patent
Nair et al.

(10) Patent No.: US 12,374,626 B2
(45) Date of Patent: Jul. 29, 2025

(54) ARCHITECTURES AND METHODS OF FABRICATING 3D STACKED PACKAGES

(71) Applicant: Intel Corporation, Santa Clara, CA (US)

(72) Inventors: Vijay K. Nair, Mesa, AZ (US); Feras Eid, Chandler, AZ (US); Thomas Sounart, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 16/490,538

(22) PCT Filed: Apr. 1, 2017

(86) PCT No.: PCT/US2017/025652
§ 371 (c)(1),
(2) Date: Aug. 31, 2019

(87) PCT Pub. No.: WO2018/182753
PCT Pub. Date: Oct. 4, 2018

(65) Prior Publication Data
US 2020/0126921 A1 Apr. 23, 2020

(51) Int. Cl.
*H01L 23/31* (2006.01)
*H01L 21/48* (2006.01)
(Continued)

(52) U.S. Cl.
CPC ...... *H01L 23/5386* (2013.01); *H01L 21/4846* (2013.01); *H01L 21/565* (2013.01); *H01L 23/3157* (2013.01); *H01L 25/0657* (2013.01)

(58) Field of Classification Search
CPC .............. H01L 27/108–10897; H01L 2924/1436–14369; H01L 27/1023;
(Continued)

(56) References Cited

U.S. PATENT DOCUMENTS 9,627,365 B1* 4/2017 Yu .................. H01L 23/5389
2009/0134528 A1* 5/2009 Lee ................. H01L 24/19
257/E23.141

(Continued)

OTHER PUBLICATIONS

International Search Report issued Apr. 9, 2018, in International Application No. PCT/US2017/025652, filed Apr. 1, 2017; 10 pages.

*Primary Examiner* — Moin M Rahman
(74) *Attorney, Agent, or Firm* — Schwabe, Williamson & Wyatt P.C.

(57) ABSTRACT

Electronics package device technology is disclosed. In one example, an electronics package device (202) comprises substrate (206) supporting an electronics component (208) and an interconnect via (216*a-c*) electrically coupled to the electronics component such that at least a portion of the electronics component is disposed between the interconnect via and the substrate. The interconnect via can be directly coupled to the electronics component such that the interconnect via and the electronics component are vertically disposed between a second electronics package device (204) and the substrate. A second electronics package device can be stacked to the first electronics package device, and can comprise similar architecture of the interconnect via attached to the electronics component as with the first electronics package. Thus, 3D package size is significantly reduced. Associated systems and processes are disclosed.

12 Claims, 7 Drawing Sheets

(51) Int. Cl.
*H01L 21/56* (2006.01)
*H01L 23/538* (2006.01)
*H01L 25/065* (2023.01)

(58) Field of Classification Search
CPC . H01L 28/40–92; H01L 27/112–11597; H01L 2924/145–1453; H01L 27/11563–11582; H01L 2924/14511; H01L 21/28282; H01L 29/4234–42352; H01L 29/518; H01L 29/792–7926; H01L 29/40117; H01L 21/02164; H01L 21/02178; H01L 21/02189; H01L 21/02192; H01L 21/76831; H01L 21/76832; H01L 21/76877; H01L 23/5226; H01L 23/53266; H01L 27/1157; H01L 27/11524; H01L 27/11529; H01L 27/11573; H01L 29/40114; H01L 21/022; H01L 23/562; H01L 23/5283; H01L 23/544; H01L 2223/5446; H01L 28/00; H01L 23/488; H01L 27/11; H01L 27/115; H01L 27/11531; H01L 21/823462; H01L 27/1104; H01L 27/1116; H01L 27/11246; H01L 27/11578; H01L 29/1083; H01L 21/28158; H01L 21/26506; H01L 29/42368; H01L 27/2481–249; H01L 27/11517–1156; H01L 2924/1438; H01L 29/42324–42336; H01L 29/788–7889; H01L 27/11551–11556; H01L 24/01; H01L 24/15; H01L 24/16; H01L 24/17; H01L 24/76; H01L 24/82; H01L 2224/76; H01L 2224/82; H01L 2224/82007; H01L 2224/821; H01L 2225/06513; H01L 2924/014; H01L 33/62; H01L 23/576; H01L 21/563; H01L 23/528; H01L 24/09; H01L 24/32; H01L 24/48; H01L 25/0657; H01L 2224/32145; H01L 2224/48091; H01L 2224/4824; H01L 2224/49112; H01L 2225/06555; H01L 2924/14; H01L 2224/2919; H01L 2224/73265; H01L 2224/73253; H01L 2224/83365; H01L 2224/16238; H01L 2224/48229; H01L 23/57; H01L 2924/10158; H01L 2225/0651; H01L 2225/06517; H01L 2225/06558; H01L 25/18; G11C 11/401–4099; G11C 14/0009–0045; G11C 2211/4016; G11C 17/02–126; H04L 9/002
See application file for complete search history.

(56) References Cited

U.S. PATENT DOCUMENTS

| | | | |
|---|---|---|---|
| 2013/0075903 A1* | 3/2013 | Pagaila | H01L 25/16 257/737 |
| 2013/0277821 A1* | 10/2013 | Lundberg | H01L 25/0657 257/713 |
| 2015/0084165 A1* | 3/2015 | Mahnkopf | H01L 21/563 257/621 |
| 2015/0325552 A1* | 11/2015 | Liu | H01L 24/82 438/109 |
| 2015/0371938 A1* | 12/2015 | Katkar | H01L 25/0652 438/666 |
| 2016/0300782 A1 | 10/2016 | Chen et al. | |
| 2016/0379935 A1* | 12/2016 | Shih | H01L 23/49827 257/738 |
| 2018/0166356 A1* | 6/2018 | Butt | H01L 21/4857 |

* cited by examiner

ARCHITECTURES AND METHODS OF FABRICATING 3D STACKED PACKAGES

PRIORITY INFORMATION

This application is a 371 U.S. national stage entry of PCT Application Serial No. PCT/US2017/025652, filed Apr. 1, 2017, which is incorporated herein by reference in its entirety.

TECHNICAL FIELD

Embodiments described herein relate generally to electronic package devices and processes.

BACKGROUND

The ever-decreasing size of electronic devices, such as wearable devices and mobile products, exerts ongoing pressure on semiconductor packages and devices to become smaller. Therefore, package size requirements progressively shrink while electrical supply requirements to dies and packages remain the same or increase.

Three dimensional (3D) stacked packages (package-on-package, etc.) contain two or more packages stacked vertically so that they occupy less x/y space and/or have greater connectivity. In most 3D stacked packages, the stacked packages are wired together by through mold vias ("TMVs") and interposers that replace edge wiring by creating vertical via connections through the mold of the body of each package. These are generally peripheral interconnect vias that consume much space in the x/y direction due to their connectivity requirements.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" structures, elements, or objects are in physical contact with one another. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

In one embodiment, an electronics package device is disclosed comprising: a substrate; an electronics component coupled to the substrate; and an interconnect via electrically coupled to the electronics component, wherein at least a portion of the electronics component is coupled between the interconnect via and the substrate. The at least portion of the electronics component is vertically disposed between the substrate and the interconnect via such that the electronics component and the interconnect via intersect along a vertical plane relative to the substrate.

In one embodiment, a process for making an electronics package device is disclosed comprising: arranging a plurality of electronics components about a carrier panel; encapsulating the plurality of electronics components with an encapsulate material; forming at least one opening in the encapsulate that exposes at least a portion of a selected electronics component; and filling the at least one opening with conductive material to form an interconnect via that is directly coupled to the selected electronics component, thereby forming an encapsulated package device.

Figure 1:
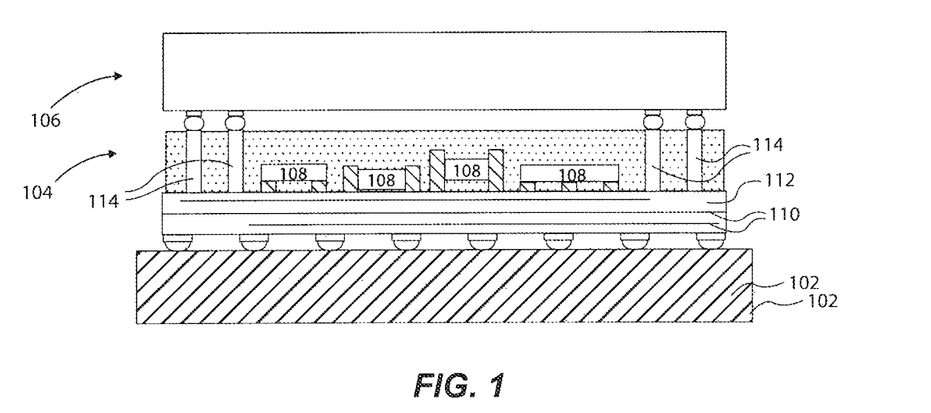
FIG. 1 illustrates a schematic side plan view of an electronics package device.

Referring to FIG. 1 there is shown a 3D stacked package 100 having a printed circuit board 102 supporting a first package 104 and a stacked second package 106 (or a die). The first package 104 has a plurality of electronics components 108, such as embedded components like active and passive devices, which are electrically coupled to interconnect traces 110 of a substrate 112 of the first package 104. A plurality of peripheral interconnect vias 114 are electrically and mechanically coupled directly to the substrate 112 at a lower end of each interconnect via 114 (i.e., to a pad or contact of the substrate). The upper end of each interconnect via 114 is electrically coupled to the second package 106 (i.e., via a solder ball and contact pad).

Generally, such interconnect vias consume a relatively large amount of space (x/y directions) about a package device relative to other interconnects (such as traces). Also, the particular peripheral locations of interconnect vias 114 require a particular distance that electrical signals have to travel from interconnect traces of the substrate 112 of the first package 104 to the interconnect traces of the second package 106. Of course, the farther electrical signals must travel, the more the latency and losses (e.g., due to thermal dissipation), thereby limiting the capacity of the particular 3D stacked package device, for instance. Thus, the required size and position of known peripheral interconnect vias can be disadvantageous when space is limited, particularly when devices are required to operate faster and cooler.

Figure 2:
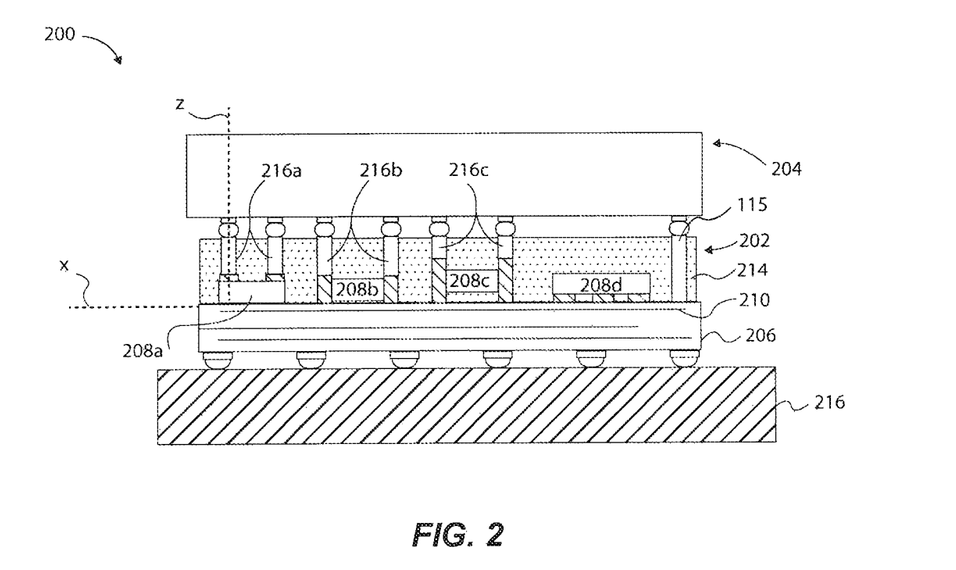
FIG. 2 illustrates a schematic side plan view of an electronics package device in accordance with an example embodiment.

FIG. 2 illustrates a schematic side plan view of a 3D package device 200 in one example of the present disclosure. The 3D package device comprises a first package device 202 and a second package device 204 (e.g., a package-on-package arrangement). The first package device 202 comprises a substrate 206 and a plurality of electronics components 208a-d coupled to the substrate 206 (e.g., bonded/soldered). In one example, electronics components 208a and 208d can each be integrated circuit devices. Electronics components 208b and 208c can each be passive electronic devices electrically and mechanically coupled to the substrate 206. Each of the electronics components 208b-d can have contact pads electrically coupled to interconnect traces 210 of the substrate 206 in a traditional manner. Notably, electronics component 208a is an integrated circuit device flipped upward such that its contact pads are facing upward and opposite the substrate 206, as shown.

An encapsulate material 214 can encapsulate the electronic components 208a-d in a traditional manner. The substrate 206 can be bonded to a printed circuit board 216 (or other assembly) in a traditional manner of pads and solder balls, as shown.

Advantageously, each of the electronics components 208a-c is electrically coupled to a respective set of interconnect vias 216a-c such that each electronics component 208a-c is coupled between the respective set of interconnect vias 216a-c and the substrate 206. As shown, each respective set of interconnect vias 216a-c is directly coupled to the respective electronics component 208a-c in a stacked configuration. For instance, electronics component 208a has a set of upper contact pads each electrically coupled to respective ones of the set of interconnect vias 216a (note that respective contact pads are not labeled for illustration clarity, but they will be referenced through the discussion of each component as appropriate). Further note that a "set" of interconnect vias discussed herein can be more than just two vias (as shown in the figures), particularly for electronic component 208a.

As shown, the set of interconnect vias 216a is directly coupled to the electronics component 208a (via the upper contact pads of 208a) such that the electronics component 208a is vertically disposed between the substrate 206 and each of the set of interconnect vias 216a. In this manner, for example, a vertical plane Z orthogonal to a planar surface X of the substrate 206 and passing through the centerline of the leftmost via 216a also intersects a portion of the electronics component 208a. In other words, a portion of the electronics component 208a and the left interconnect via 216a intersect along a vertical plane Z relative to a planar surface X of the substrate 206, for example. Thus, the vertical plane Z is substantially orthogonal to the planar surface X of the substrate 206. The same or similar principle holds true for each of the described sets of interconnect vias 216a-c and the respective electronic components 208a-c attached thereto.

Each interconnect via may not be entirely vertical, however, and may each traverse at an angle through the encapsulate material 214, or even traverse along horizontal and vertical planes relative to plane X though the encapsulate material 214. In any event, at least a portion of each interconnect via intersects with at least a portion of the respective attached electronics component along a vertical plane relative to the substrate 206, as illustrated with the example of electronics component 208a.

Advantageously, by arranging the interconnect vias 216a-c as shown and described, a distance that electrical signals travel is reduced (as compared to vias directly coupled to a substrate like FIG. 1) because the interconnect vias 216a-c are directly coupled to respective electronic components (instead of directly to the substrate 206) and then directly coupled to the second package device 204. Thermal dissipation is reduced as a result of this reduced distance of travel of electrical signals, which improves performance of the overall package assembly.

The first package device 202 can be bonded to a printed circuit board 216 (or other electronics substrate or assembly) via solder balls, as shown. The second package device 204 can be bonded to a top of the first package device 202 via solder balls attached to tops of respective interconnect vias 216a-c, as shown. In one example, the second package device 204 can be a die bonded to the top of the first package device 202 about the solder balls and pads.

Figure 3A:
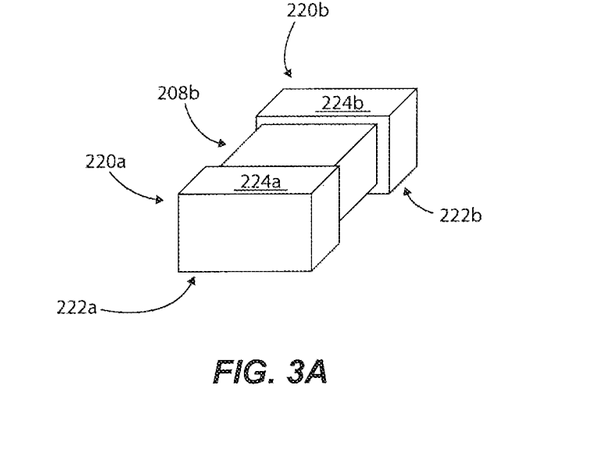
FIG. 3A illustrates an isometric view of a passive electronics component of an electronics package device in accordance with an example embodiment.
Figure 3B:
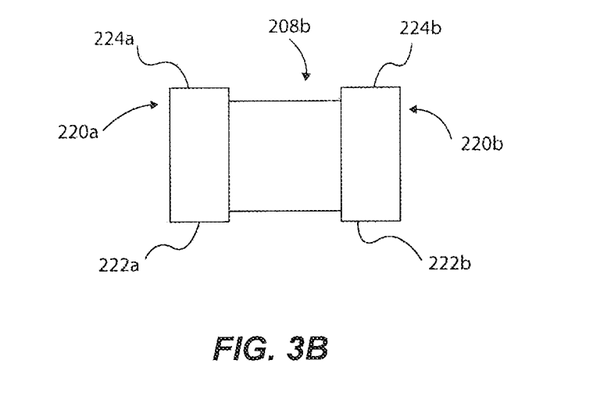
FIG. 3B illustrates a side view of the passive electronics component of FIG. 3A in accordance with an example embodiment.

FIG. 3A shows an isometric view of a passive electronic component 208b (i.e., of FIG. 2) and FIG. 3B is a side view of the passive electronic component 208b, which can be a resistor, capacitor, inductor, transformer, etc. Notably, the passive electronics component 208b comprises a first end contact pad 220a and a second end contact pad 220b each directly electrically coupled to the substrate 206 (FIG. 2). Each end contact pad 220a and 220b is conductive material that covers five sides of the opposing ends of the passive electronics component 208b. Each end contact pad 220a and 220b comprise a lower surface 222a and 222b, respectively, directly coupled to pads of the substrate 206 (FIG. 2). And each contact pad 220a and 220b comprises an upper surface 224a and 224b each directly coupled to a bottom of a respective interconnect via of the set of interconnect vias 216b. This is shown in first package device 202 of FIG. 2 for each of electronics components 208b and 208c.

Advantageously, a particular package of the present application is significantly reduced in size in the x-y-z sized because existing via bars, through mold vias, and interposers are either reduced in number or eliminated in packages of the present disclosure because interconnect vias are each stacked directly onto the electronics components (e.g., FIG. 2). For example, a 10×10 mm package with two rows of peripheral interconnect via bars (with 500 um diameter and 750 um pitch) can be reduced in size by at least 2.5 mm in each of the x and y directions of the package. This is approximately a 45 percent reduction in the x-y area of the package (assuming the typically used via bars are eliminated in lieu of using the stacked, direct top side connections of the present application). This is a significant reduction in package size, which results in significantly smaller size devices, such as wearables and mobile devices.

Figure 4:
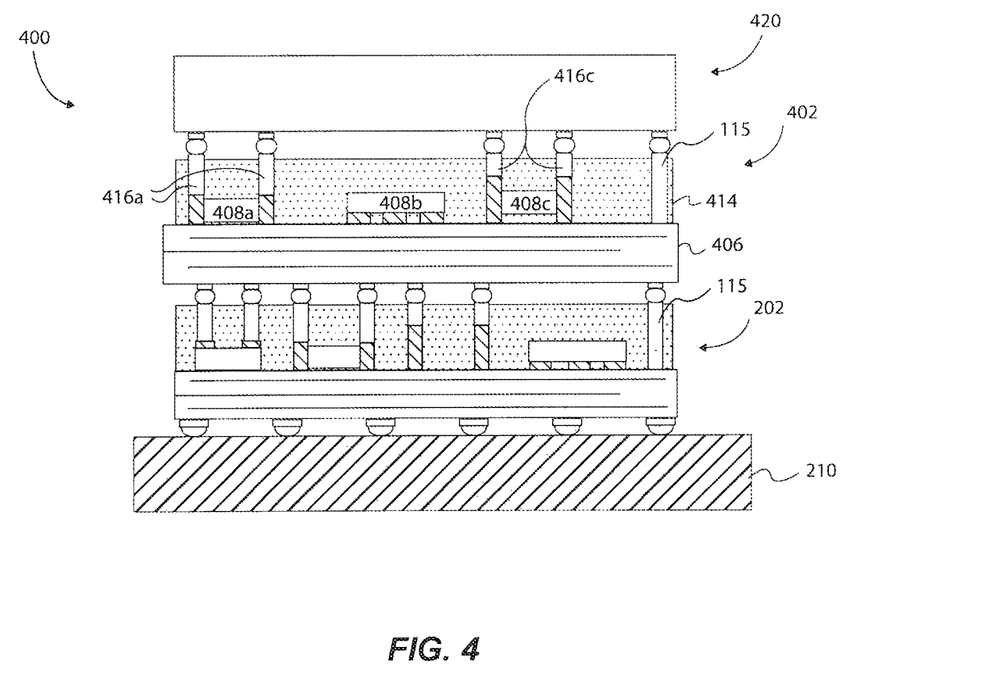
FIG. 4 illustrates a schematic side plan view of an electronics package device in accordance with an example embodiment.

FIG. 4 shows a schematic side plan view of a 3D package device 400 comprising the first package device 202 (of FIG. 2) and a second package device 402 stacked on the first package 202. Note that the reference labels are omitted on FIG. 4 from package 202 for purposes of illustration clarity, but see FIG. 2 for reference. Similar to the first package device 202, the second package device 402 comprises a substrate 406 and a plurality of electronics components 408a-c coupled to the substrate 406 (e.g., bonded/soldered).

Components 408a and 408c can each be the passive electronics device of FIGS. 3A and 3B that are electrically and mechanically coupled to the substrate 406. The electronics component 408b can be an integrated circuit device soldered onto the substrate 406, as shown.

An encapsulate material 414 can encapsulate the electronic components 408a-c in a traditional manner. The substrate 406 can be bonded to the first package device 202 via pads and solder balls, as shown.

Advantageously, each electronics component 408a and 408c is electrically coupled to a respective set of interconnect vias 416a and 416c such that each electronics component 408a and 408c is coupled between the respective set of interconnect vias 416a and 416c and the substrate 406. As shown, each respective set of interconnect vias 416a and 416c is directly coupled to the respective electronics component 408a and 408c in a stacked configuration.

A third package device 420 can be bonded to a top of the second package device 402 via solder balls attached to tops of respective interconnect vias 416a and 416c. In one example, the third package device 420 can be a die bonded to the top of the second package device 402 in a similar manner. Supplemental package devices (e.g., like 202 and 402) can be bonded to the 3D package device 400 on top of package device 420.

Figure 5:
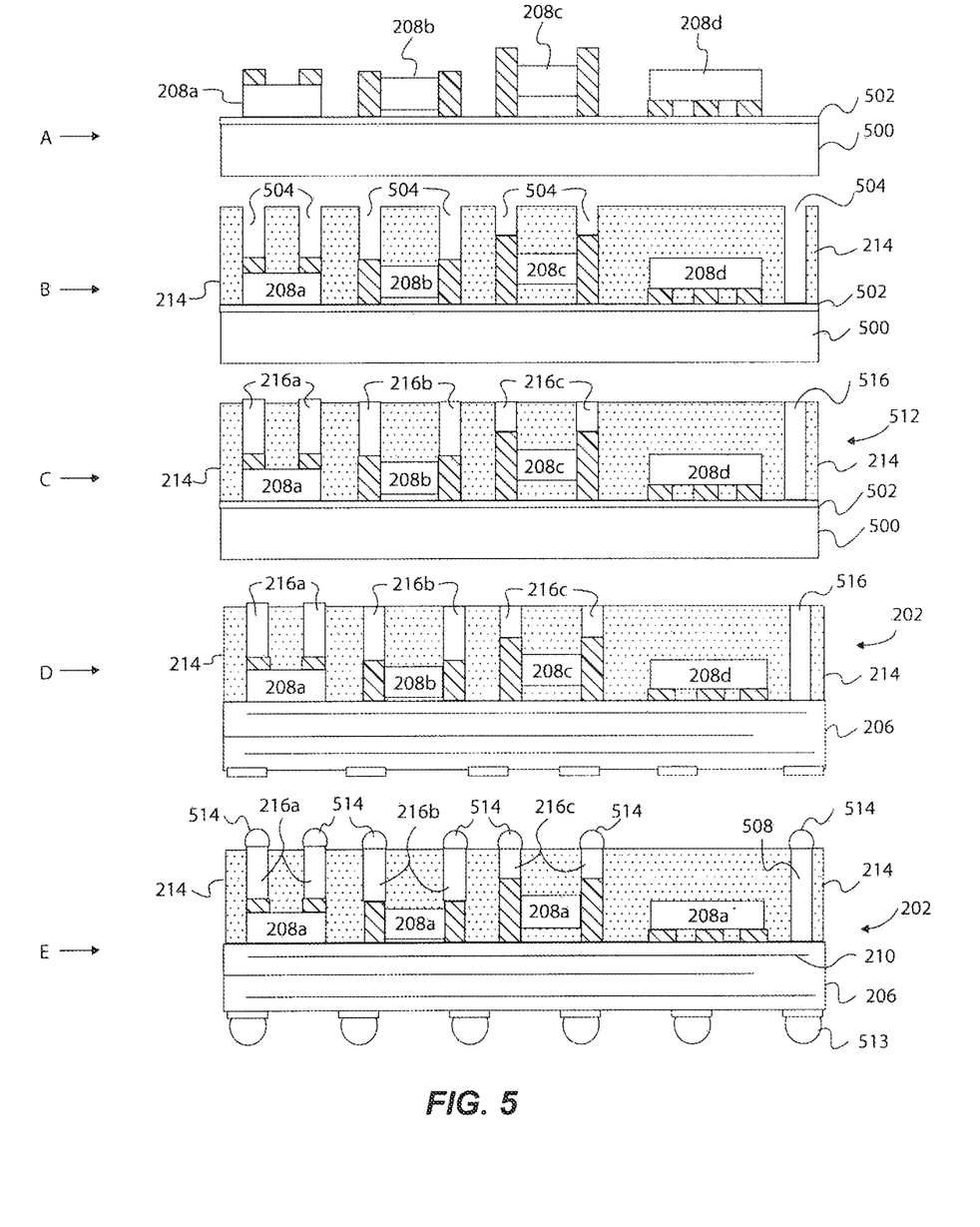
FIG. 5 illustrates a process for manufacturing an electronics package device in accordance with an example embodiment.

Although FIG. 4 shows traditional/known peripheral interconnect vias (right side) of each package 202 and 204, it will be appreciated that any of the package devices contemplated herein can be entirely devoid of such peripheral interconnect vias. However, some peripheral vias may still exists in the packages discussed herein, such as shown on FIGS. 2 and 4 (e.g., peripheral vias 115). FIG. 5 illustrates a process for making the first package device 202 (e.g., of FIG. 2) showing a plurality of process side plan views in accordance with one example of the present disclosure. At operation A, the plurality of electronics components 208a-d are arranged about a carrier panel 500, and temporarily adhered via a release film 502 (e.g., heat release file) to the carrier panel 500, for example. Each of the electronics components 208a-d has respective sets of contact pads (cross hatched), as further discussed above. At operation B, the plurality of electronics components 208a-d are encapsulated with an encapsulate material 214 in a process that forms openings 504 that each expose at least a portion of each electronics component 208a-d (i.e., exposing the contact pads of each electronics component). As mentioned above, a "set" can mean two or more regarding any of the "sets" discussed herein.

In a first example of forming the openings 504, the openings 504 are formed by selectively masking a top of the encapsulate material 214 and then removing un-masked portions of the encapsulate material 214 to form the openings 504. This can be achieved, for example, by implementing a process selected from one of dry etching, wet etching, water blasting, laser etching, and skiving. In a second example, and before the encapsulate material 214 is deposited, a mold chase having pedestals positioned about the mold chase corresponding to the various respective positions of the contact pads of each of the electronics components 208a-c is used. The mold chase is selectively positioned relative to the electronics components 208a-c, and then the encapsulate material 214 is deposited. Then, the mold chase (having pedestals) is removed, thereby leaving behind cavities or forming the openings 504 about the encapsulate material 214.

Once the openings 504 are formed (by either the first or second examples above), at operation C the openings 504 are filled with conductive material to form the sets of interconnect vias 216a-c. Thus, each set of interconnect vias 216a-c are directly coupled to the respective electronics components 208a-c, as shown, thereby forming an encapsulated package device (e.g., 202, 402, etc.). A peripheral interconnect via 516 can also be formed during processes of forming the stacked interconnect vias 216a-c. The openings 504 can be filled by implementing a process selected from one of stencil printing, screen printing, and dispensing the conductive material, or other suitable means. Once filled, in one example, the encapsulate material 214 can be optionally grinded to a desired surface height. Thus, an encapsulated package device 512 is formed.

At operation D, the encapsulated set of package devices 512 is removed from the carrier 500 (e.g. by detaching the encapsulated set of devices 512 from the release layer 502 and carrier panel 500). In one aspect, conductive trace and dielectric layers can be formed onto the encapsulated set of devices 512 to form the substrate 206, thereby forming the electronics package devices 202. Finally, at operation E lower solder balls 513 can be attached to the bottom of the substrate 206 as shown for bonding to a printed circuit board, as also described above. Upper solder balls 514 can be attached to the tops of each interconnect via in the via sets 216a-c (and 508) for bonding, for example, to a second integrated circuit device, such as a second package device or a die, as discussed above.

Figure 6:
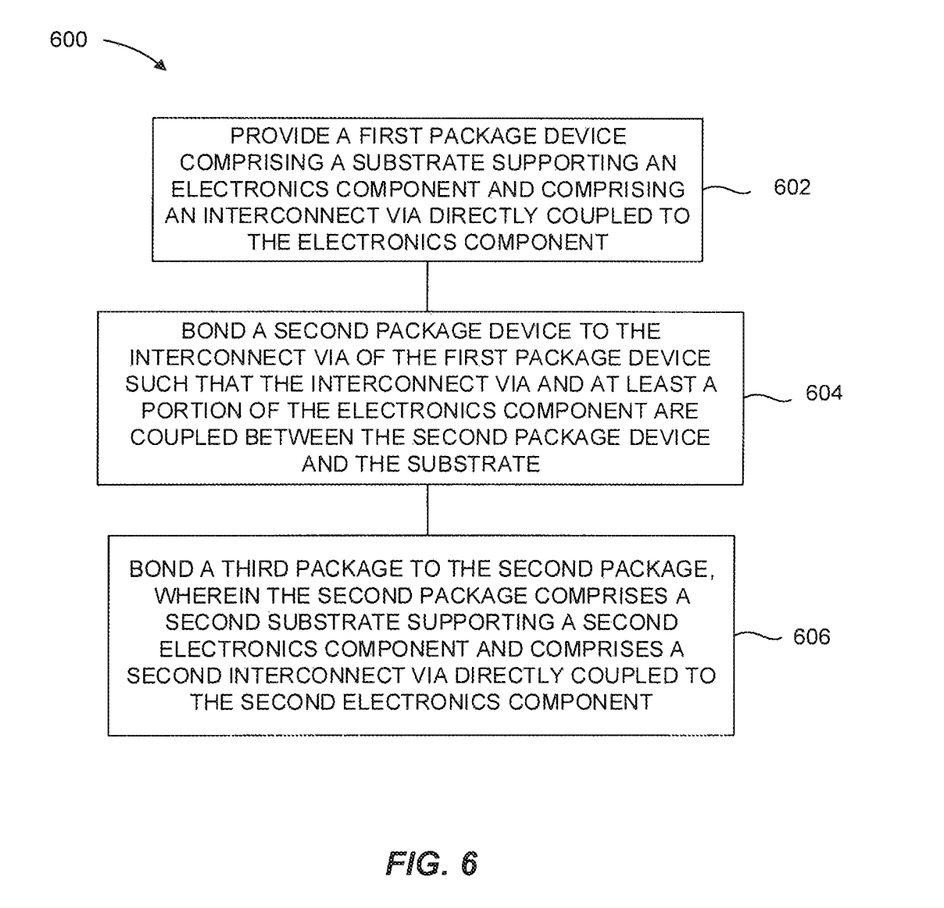
FIG. 6 is a flow diagram articulating a process for manufacturing an electronics package device in accordance with an example embodiment.

FIG. 6 illustrates a process 600 for making an electronics package device according to an example of the present disclosure, such as a process for making the electronics package devices 202 and 402 discussed above. At operation 602 the process comprises providing a first package device (e.g., 202) comprising a substrate (e.g., 206) supporting an electronics component (e.g., 208a) and comprising an interconnect via (e.g., one of 216a) directly coupled to the electronics component. The first package device can be formed as discussed regarding FIG. 5, and as further discussed regarding FIG. 7 below.

At operation 604 the process comprises bonding a second package device (e.g., 402 of FIG. 4) to the interconnect via of the first package device such that the interconnect via (e.g., 216a) and at least a portion of the electronics component (e.g., 208a) are coupled between the second package device (e.g., 402) and the substrate (e.g., 206). At operation 606 the process comprises bonding a third package device (e.g., 420 of FIG. 4) to the second package device, wherein the second package device comprises a second substrate (e.g., 406) supporting a second electronics component (e.g., 408a) and a second interconnect via (e.g., one of 416a). Thus, the second electronics component and the second interconnect via are coupled between the second substrate and the third package device. As discussed above, each interconnect via can be directly coupled to and vertically positioned relative to the attached electronics component.

Figure 7:
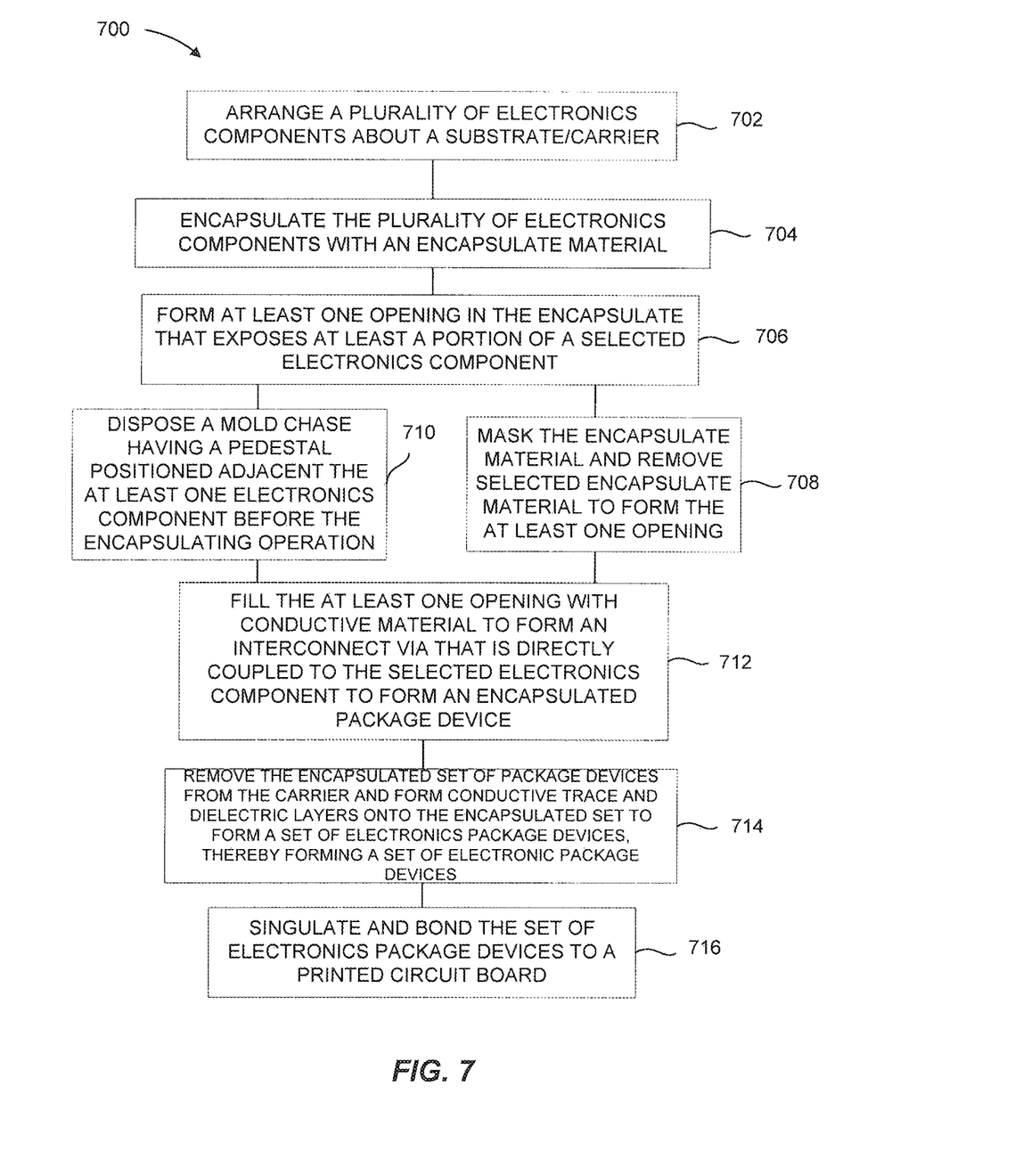
FIG. 7 is a flow diagram showing a process for manufacturing an electronics package device in accordance with an example embodiment.

FIG. 7 illustrates a process 700 for making an electronics package device according to an example of the present disclosure, such as a process for making the electronics package device 202 discussed above. At operation 702 the process comprises arranging a plurality of electronics components about a substrate (e.g., operation A of FIG. 5). At operation 704 the process comprises encapsulating the plurality of electronics components with an encapsulate material (e.g., operation B of FIG. 5). At operation 706 the process comprises forming at least one opening in the encapsulate that exposes at least a portion of a selected electronics component (e.g., operation B of FIG. 5). Operations 704 and 706 can both be achieved in two different ways, as discussed above regarding FIG. 5 (operation B). For instance, at operation 708 the process can comprise masking the encapsulate material and removing selected encapsulate material to form the at least one opening (operation B). Alternatively, at operation 710 the process can comprise disposing a mold chase having a pedestal positioned adjacent the at least one electronics component before the encapsulating operation (operation B). Once the opening is formed, at operation 712 the process comprises filling the at least one opening with conductive material to form an interconnect via that is directly coupled to the selected electronics component, thereby forming an encapsulated package device (e.g., operation C of FIG. 5).

At operation 714 the process can comprise removing the encapsulated set of package devices from the carrier and then forming conductive trace and dielectric layers onto the encapsulated package device (a set) (in a traditional manner) to form a set of electronics package devices (e.g., operation D of FIG. 5). At operation 716 the process can comprise singulating and bonding the electronics package devices to a printed circuit board about the bonding surface (e.g., as described regarding FIGS. 2 and 4).

Figure 8:
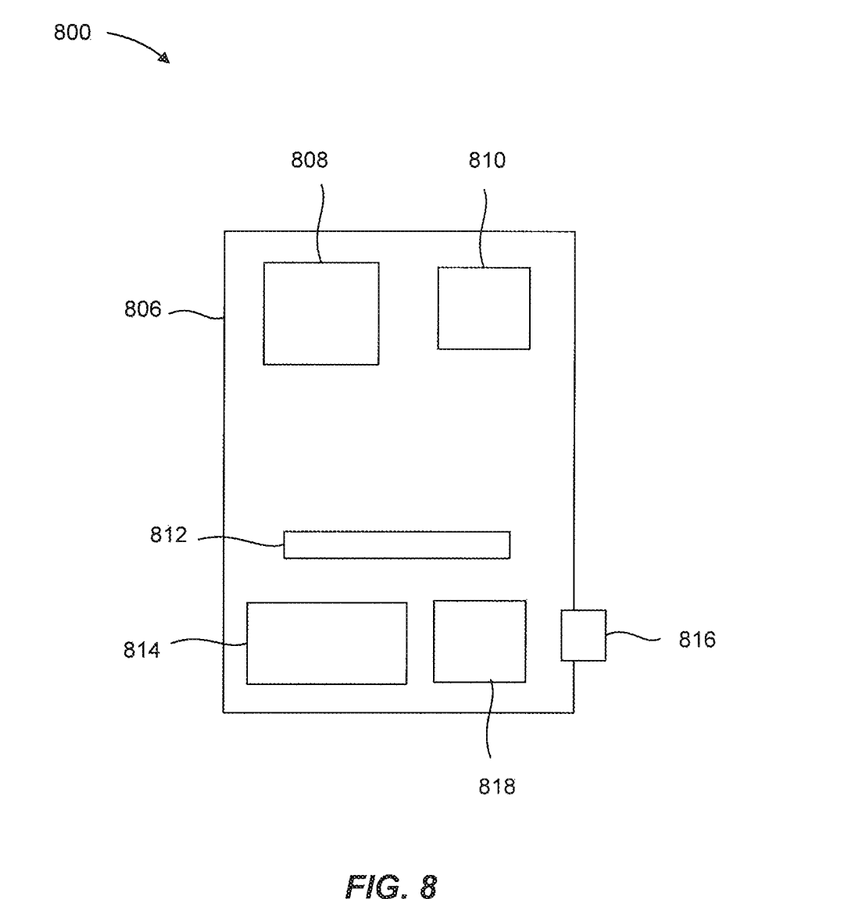
FIG. 8 illustrates an electronics or computing system having an electronics package device in accordance with an example embodiment.

FIG. 8 illustrates an example computing system 800. The computing system 800 can include a 3D package device 808 having at least two electronics package devices (e.g., 202 and 402) as disclosed herein, coupled to a motherboard 806. In one aspect, the computing system 800 can also include a processor 810, a memory device 812, a radio 818, a heat sink 814, a port 816, a slot, or any other suitable device or component, which can be operably coupled to the motherboard 806. The computing system 800 can comprise any type of computing system, such as a desktop computer, a laptop computer, a tablet computer, a smartphone, a server, etc. Other embodiments need not include all of the features specified in FIG. 8, and may include alternative features not specified in FIG. 8.

EXAMPLES

The following examples pertain to further embodiments.

In one example there is provided an electronics package device comprising: a substrate; an electronics component coupled to the substrate; and an interconnect via electrically coupled to the electronics component, wherein at least a portion of the electronics component is coupled between the interconnect via and the substrate.

In one example, the interconnect via is coupled to the electronics component.

In one example, the at least portion of the electronics component is vertically disposed between the substrate and the interconnect via such that the electronics component and the interconnect via intersect along a vertical plane relative to the substrate.

In one example, the electronics component comprises one of an active and passive electronics component.

In one example, the passive electronics device comprises a first end contact pad and a second end cap pad each directly electrically coupled to the substrate, wherein the interconnect via is directly coupled to the first end contact pad, and a supplemental interconnect via is directly coupled to the second end contact pad.

In one example, the active electronics component comprises an integrated circuit device having a contact pad disposed opposite the substrate and directly electrically coupled to the interconnect via.

In one example, the electronics package device comprises an integrated circuit component electrically bonded to the interconnect via.

In one example, the integrated circuit component comprises one of a semiconductor package and a semiconductor die.

In one example, the electronics package device comprises an encapsulate material that encapsulates the electronics component and the interconnect via, wherein the encapsulate material is formed with a cavity adjacent the electronics component wherein the interconnect via fills the cavity.

In one example, the electronics package device is devoid of peripheral interconnect vias.

In one example there is provided an electronics assembly comprising an electronics component encapsulated within the electronics package device, and an interconnect via directly coupled to the electronics component.

In one example, the electronics assembly further comprises a substrate supporting the electronics component, wherein the electronics component is disposed between the interconnect via and the substrate.

In one example, at least a portion of the electronics component is vertically disposed between the substrate and the interconnect via such that the electronics component and the interconnect via intersect along a vertical plane relative to the substrate.

In one example, one side of the electronics component is directly coupled to the substrate and the opposing side of the electronics component directly coupled to the interconnect via.

In one example, a first end of the interconnect via is directly coupled to a top of the electronics component and an opposing second end of the interconnect via is configured to be bonded to an integrated circuit component.

In one example, the electronics package device comprises a plurality of electronic components and a plurality of interconnect vias, wherein each interconnect via is directly coupled to a respective electronic component such that each electronic component is disposed between the respective interconnect via and the substrate.

In one example, each interconnect via is not directly coupled to a conductive pad of the substrate.

In one example, the electronics package device comprises a plurality of electronics package devices stacked to each other, and each directly coupled to a respective interconnect via of an adjacent electronics package device.

In one example there is provided an electronics system comprising: a printed circuit board; an electronics package device coupled to the printed circuit board, the electronics package device package comprising a substrate supporting a plurality of electronics components and comprising a plurality of interconnect vias, wherein each interconnect via is directly coupled to a corresponding electronics component; and an integrated circuit component bonded to the electronics package device, wherein each interconnect via and a respective electronics component are coupled between the integrated circuit component and the substrate of the electronics package device.

In one example, each electronics component is directly coupled to the interconnect via.

In one example, the electronics component and the interconnect via are coupled together such that a vertical plane orthogonal to a support surface of the substrate intersects the interconnect via and the electronics component.

In one example, a first end of the interconnect via is directly coupled to a top of the electronics component and an opposing second end of the interconnect via is configured to be bonded to an integrated circuit component.

In one example the system further comprises a plurality of electronic components and a plurality of interconnect vias, wherein each interconnect via is directly coupled to a respective electronic component such that each electronic component is disposed between the respective interconnect via and the substrate.

In one example, each interconnect via is not directly coupled to a conductive pad of the substrate.

In one example the system further comprises a plurality of electronics package devices stacked to each other, and each directly coupled to a respective interconnect via of an adjacent electronics package device.

In one example there is provided a process comprising providing a first package device comprising a substrate supporting an electronics component and comprising an interconnect via directly coupled to the electronics component. Process further comprises bonding a second package device to the interconnect via of the first package device such that the interconnect via and at least a portion of the electronics component are coupled between the second package device and the substrate.

In one example, the process can further comprise bonding a third package device to the second package device, wherein the second package device comprises a second substrate supporting a second electronics component and a second interconnect via. Thus, the second electronics component and the second interconnect via are coupled between the second substrate and the third package device.

In one example, the at least portion of the electronics component is vertically disposed between the substrate and the interconnect via such that the electronics component and the interconnect via intersect along a vertical plane relative to the substrate.

In one example, the second package device is formed by a process comprising: coupling the electronics component to the substrate; encapsulating the electronics component with an encapsulate material; forming an opening in the encapsulate that exposes at least a portion of the electronics component; and filling the opening with conductive material to form the interconnect via that is directly coupled to the electronics component.

In one example, the second package device is formed by a process comprising: coupling the second electronics component to the second substrate; encapsulating the second electronics component with an encapsulate material; forming an opening in the encapsulate that exposes at least a portion of the second electronics component; and filling the opening with conductive material to form the second interconnect via that is directly coupled to the second electronics component.

In one example there is provided a process comprising: arranging a plurality of electronics components about a carrier panel; encapsulating the plurality of electronics components with an encapsulate material; forming at least one opening in the encapsulate that exposes at least a portion of a selected electronics component; and filling the at least one opening with conductive material to form an interconnect via that is directly coupled to the selected electronics component, thereby forming an encapsulated package device.

In one example, the carrier panel comprises a planar surface supporting the plurality of electronics components.

In one example, forming the at least one opening comprises selectively masking the encapsulate material and removing selected encapsulate material to form the at least one opening.

In one example, removing the selected encapsulate material comprises implementing a process selected from one of dry etching, wet etching, water blasting, laser etching, and skiving.

In one example, forming the at least one opening comprises disposing a mold chase having a pedestal positioned adjacent the at least one electronics component before the encapsulating operation.

In one example, the process further comprises removing the mold chase such that the pedestal forms the at least one opening.

In one example, filling the at least one opening further comprises implementing a process selected from one of stencil printing, screen printing, and dispensing the conductive material.

In one example, the process further comprises grinding the encapsulate material after filling the at least one opening.

In one example, the process further comprises removing the encapsulated package device from the carrier and forming conductive trace and dielectric layers onto the encapsulated package device to form a set of electronics package devices.

In one example, the process further comprises attaching a solder ball to the interconnect via, and attaching assembly solder balls along a bonding surface of the electronics package device.

In one example, the process further comprises singulating and bonding the electronics package device to a printed circuit board about the bonding surface.

In one example, the process further comprises bonding an integrated circuit component to the interconnect via about the solder ball such that the interconnect via and at least a portion of the electronics component are directly coupled between the integrated circuit component and the substrate.

In one example, the integrated circuit device comprises one of a die and a second package device.

In one example, the process further comprises bonding a second integrated circuit component to the second package device, wherein the second package device comprises a second substrate supporting a second electronics component and comprises a second interconnect via directly coupled to the second electronics component.

In one example, the at least portion of the electronics component is vertically disposed between the substrate and the interconnect via such that the electronics component and the interconnect via intersect along a vertical plane relative to the substrate.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronics package device, comprising:
   a substrate, the substrate having an uppermost surface;
   a first electronics component on and in physical contact with the substrate;
   a second electronics component on and in physical contact with the substrate, the second electronics component laterally spaced apart from the first electronics component;
   an encapsulant material encapsulating the first electronics component and the second electronics component, the encapsulant material having a bottommost surface above the uppermost surface of the substrate, and the first electronics component having an upper contact pad;
   an interconnect via in direct physical contact with the upper contact pad of the first electronics component, wherein at least a portion of the first electronics component is disposed between the interconnect via and the substrate, and wherein the interconnect via is in the encapsulant material; and
   a solder ball in direct physical contact with the interconnect via, the solder ball vertically overlapping with the interconnect via.

2. The electronics package device of claim 1, wherein the at least portion of the first electronics component is vertically disposed between the substrate and the interconnect via such that the first electronics component and the interconnect via intersect along a vertical plane relative to the substrate.

3. The electronics package device of claim 1, wherein the first electronics component comprises one of an active and passive electronics component.

4. The electronics package device of claim 3, wherein the passive electronics device comprises a first end contact pad and a second end contact pad each directly electrically coupled to the substrate, wherein the interconnect via is directly coupled to the first end contact pad, and a supplemental interconnect via is directly coupled to the second end contact pad.

5. The electronics package device of claim 1, further comprising an integrated circuit component electrically bonded to the interconnect via.

6. The electronics package device of claim 5, wherein the integrated circuit component comprises one of a semiconductor package and a semiconductor die.

7. The electronics package device of claim 1, wherein the electronics package device is devoid of peripheral interconnect vias.

8. An electronics package device for a 3D stacked package, comprising:
   a first electronics component and a second electronics component encapsulated by an encapsulant material within the electronics package device, the first electronics component and the second electronics component on a substrate, the second electronics component laterally spaced apart from the first electronics component, wherein one side of the first electronics component and the second electronics component is directly coupled to the substrate, and the first electronics component has an upper contact pad, wherein the encapsulant material has a bottommost surface above an uppermost surface of the substrate;
   an interconnect via in direct physical contact with the upper contact pad of the first electronics component, wherein the first electronics component is disposed between the interconnect via and the substrate, wherein the interconnect via is in the encapsulant material; and
   a solder ball in direct physical contact with the interconnect via, the solder ball vertically overlapping with the interconnect via.

9. The electronics package device of claim 8, wherein at least a portion of the first electronics component is vertically disposed between the substrate and the interconnect via such that the first electronics component and the interconnect via intersect along a vertical plane relative to the substrate.

10. The electronics package device of claim 8, wherein a first end of the interconnect via is directly coupled to a top of the first electronics component and an opposing second end of the interconnect via is configured to be bonded to an integrated circuit component.

11. The electronics package device of claim 8, further comprising a plurality of electronic components and a plurality of interconnect vias, wherein each interconnect via is directly coupled to a respective electronic component such that each electronic component is disposed between the respective interconnect via and the substrate.

12. An electronics package device, comprising:
   a substrate, the substrate having an uppermost surface;
   an electronics component on and in physical contact with the substrate;
   an encapsulant material encapsulating the electronics component, the encapsulant material having a bottommost surface above the uppermost surface of the substrate, and the electronics component having an upper contact pad;
   an interconnect via in direct physical contact with the upper contact pad of the electronics component, wherein at least a portion of the electronics component is disposed between the interconnect via and the substrate, and wherein the interconnect via is in the encapsulant material; and
   a solder ball in direct physical contact with the interconnect via, the solder ball vertically overlapping with the interconnect via, wherein the electronics component comprises one of an active and passive electronics component, wherein the passive electronics device comprises a first end contact pad and a second end contact pad each directly electrically coupled to the substrate, wherein the interconnect via is directly coupled to the first end contact pad, and a supplemental interconnect via is directly coupled to the second end contact pad.

* * * * *